(12) United States Patent
Chua et al.

(10) Patent No.: US 7,102,152 B2
(45) Date of Patent: Sep. 5, 2006

(54) DEVICE AND METHOD FOR EMITTING OUTPUT LIGHT USING QUANTUM DOTS AND NON-QUANTUM FLUORESCENT MATERIAL

(75) Inventors: Janet Bee Yin Chua, Perak (MY); Kok Chin Pan, Penang (MY); Kee Yean Ng, Penang (MY); Kheng Leng Tan, Penang (MY); Tajul Arosh Baroky, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 58 days.

(21) Appl. No.: 10/966,534

(22) Filed: Oct. 14, 2004

(65) Prior Publication Data

US 2006/0081862 A1   Apr. 20, 2006

(51) Int. Cl.
*H01L 31/0328* (2006.01)
(52) U.S. Cl. ................ 257/14; 257/676; 257/E25.032; 257/E29.071; 438/123
(58) Field of Classification Search ..................... None
See application file for complete search history.

(56) References Cited

U.S. PATENT DOCUMENTS

| | | | |
|---|---|---|---|
| 6,277,301 | B1 | 8/2001 | Hohn et al. |
| 6,501,091 | B1 * | 12/2002 | Bawendi et al. .............. 257/14 |
| 2003/0127659 | A1 | 7/2003 | Bawendi et al. |
| 2003/0127660 | A1 | 7/2003 | Bawendi et al. |
| 2004/0245912 | A1 * | 12/2004 | Thurk et al. ................ 313/484 |

* cited by examiner

*Primary Examiner*—Nathan J. Flynn
*Assistant Examiner*—Scott R. Wilson

(57) ABSTRACT

A device and method for emitting output light utilizes both quantum dots and non-quantum fluorescent material to convert at least some of the original light emitted from a light source of the device to longer wavelength light to change the color characteristics of the output light. The device can be used to produce broad-spectrum color light, such as white light.

20 Claims, 3 Drawing Sheets

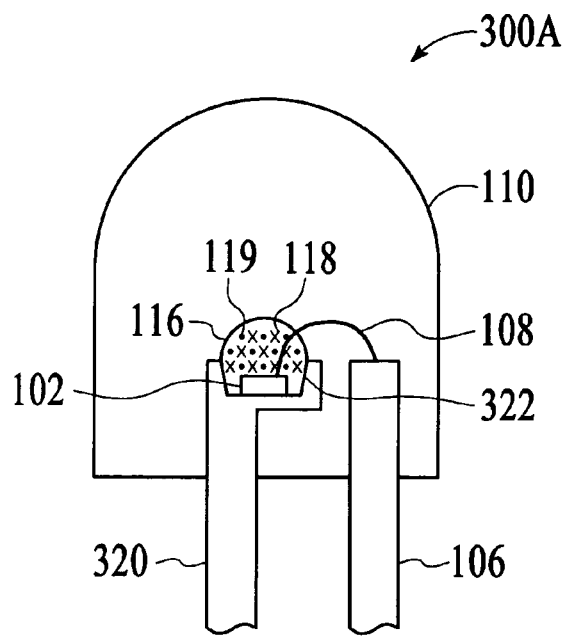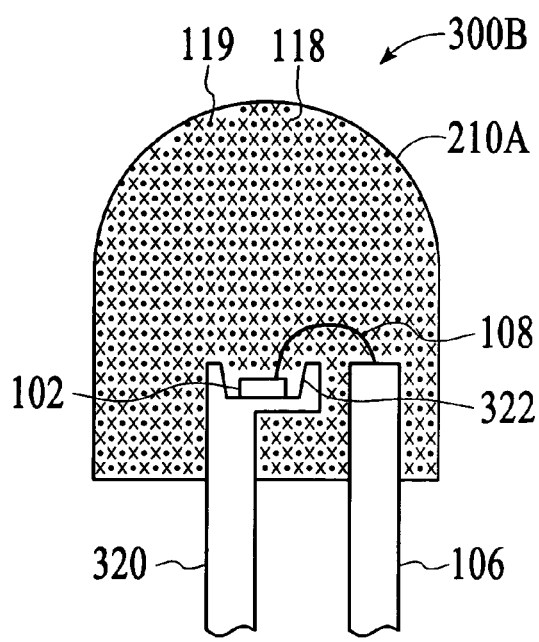
FIG. 3A        FIG. 3B
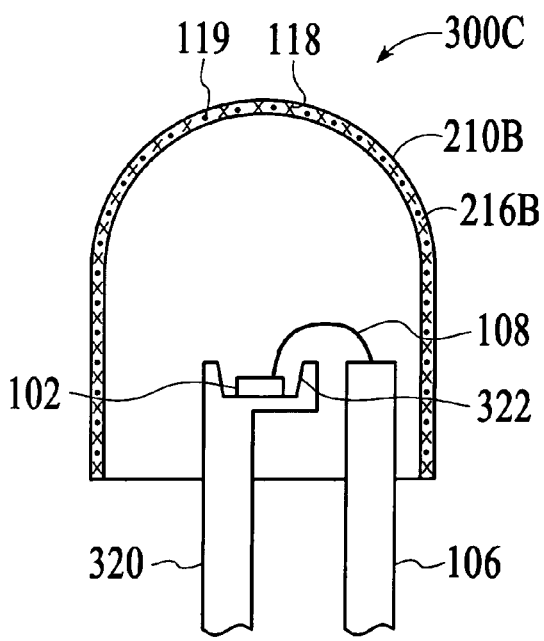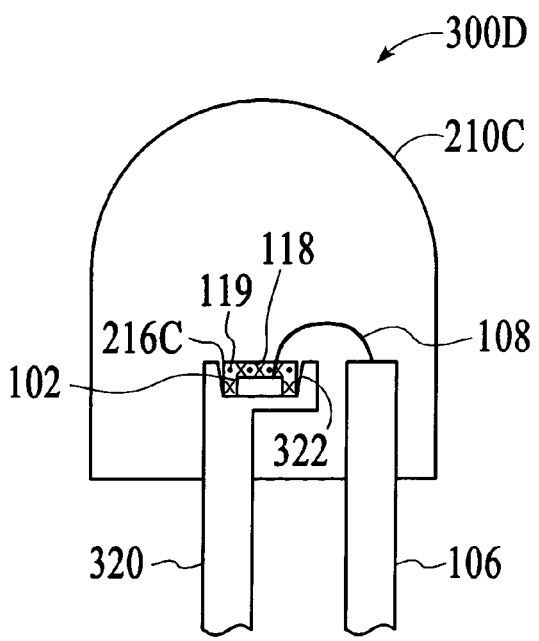
FIG. 3C        FIG. 3D

DEVICE AND METHOD FOR EMITTING OUTPUT LIGHT USING QUANTUM DOTS AND NON-QUANTUM FLUORESCENT MATERIAL

BACKGROUND OF THE INVENTION

Existing light emitting diodes ("LEDs") can emit light in the ultraviolet ("UV"), visible or infrared ("IR") wavelength range. These LEDs generally have narrow emission spectrum (approximately +/−10 nm). As an example, a blue InGaN LED may generate light with wavelength of 470 nm+/−10 nm. As another example, a green InGaN LED may generate light with wavelength of 510 nm+/−10 nm. As another example, a red AlInGaP LED may generate light with wavelength of 630 nm+/−10 nm.

However, in some applications, it is desirable to use LEDs that can generate broader emission spectrums to produce desired color light, such as white light. Due to the narrow-band emission characteristics, these monochromatic LEDs cannot be directly used to produce broad-spectrum color light. Rather, the output light of a monochromatic LED must be mixed with other light of one or more different wavelengths to produce broad-spectrum color light. This can be achieved by introducing one or more fluorescent materials into the lamp of a monochromatic LED to convert some of the original light into longer wavelength light through fluorescence. The combination of original light and converted light produces broad-spectrum color light, which can be emitted from the LED as output light. The most common fluorescent materials used to create LEDs that produce broad-spectrum color light are fluorescent particles made of phosphors, such as Garnet-based phosphors, Silicate-based phosphors, Orthosilicate-based phosphors, Sulfide-based phosphors, Thiogallate-based phosphors and Nitride-based phosphors. These phosphor particles are typically mixed with the transparent material used to form the lamps of LEDs so that original light emitted from the semiconductor die of an LED can be converted within the lamp of the LED to produce the desired output light.

A concern with the use of phosphor particles to produce broad-spectrum color output light is that the output light may have a low Color Rendering Index (CRI), which may be as low as sixty-five (65). This is readily apparent by examining the optical spectrum of the output light, which would typically have large gaps or valleys at various wavelengths.

In view of this concern, there is a need for a device and method for emitting broad-spectrum color output light with high CRI.

SUMMARY OF THE INVENTION

A device and method for emitting output light utilizes both quantum dots and non-quantum fluorescent material to convert at least some of the original light emitted from a light source of the device to longer wavelength light to change the color characteristics of the output light. The device can be used to produce broad-spectrum color light, such as white light.

A device for emitting output light in accordance with an embodiment of the invention includes a light source that emits original light and a wavelength-shifting region optically coupled to the light source to receive the original light. The wavelength-shifting region includes at least one type of quantum dots to convert some of the original light to first converted light. The wavelength-shifting region further includes non-quantum fluorescent material to convert some of the original light to second converted light. The first converted light and the second converted light are components of the output light.

A method for emitting output light in accordance with an embodiment of the invention includes generating original light, receiving the original light, including converting some of the original light to first converted light using at least one type of quantum dots and converting some of the original light to second converted light using non-quantum fluorescent material, and emitting the first converted light and the second converted light as components of the output light.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIGS. 3A, 3B, 3C and 3D are diagrams of LEDs with a leadframe having a reflector cup in accordance with an alternative embodiment of the invention.

DETAILED DESCRIPTION

Figure 1:
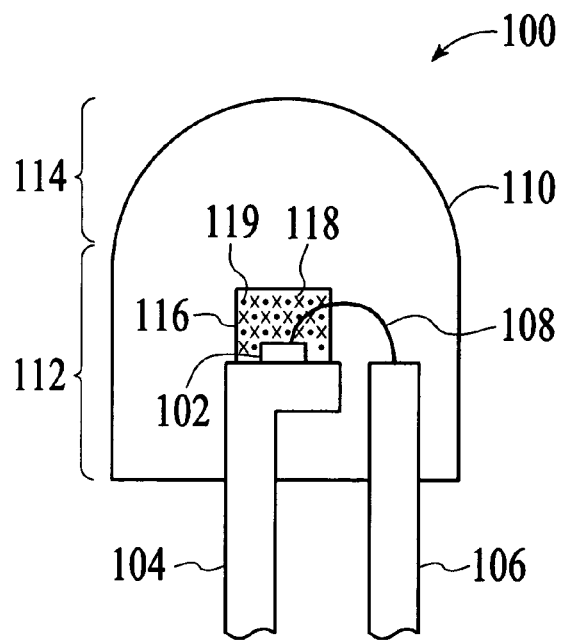
FIG. 1 is a diagram of a light emitting diode (LED) in accordance with an embodiment of the invention.

With reference to FIG. 1, a light emitting diode (LED) 100 in accordance with an embodiment of the invention is shown. The LED 100 is designed to produce broad-spectrum color output light, such as "white" light, with high Color Rendering Index (CRI). The broad-spectrum color output light is produced by converting some of the original light generated by the LED 100 into longer wavelength light using different types of photoluminescent materials. The use of different types of photoluminescent materials compensates for wavelength deficiencies that exist when only one type of photoluminescent materials is used to produce broad-spectrum color light, thereby increasing the CRI.

As shown in FIG. 1, the LED 100 is a leadframe-mounted LED. The LED 100 includes an LED die 102, leadframes 104 and 106, a wire 108 and a lamp 110. The LED die 102 is a semiconductor chip that generates light of a particular peak wavelength. Thus, the LED die 102 is the light source for the LED die. Although the LED 100 is shown in FIG. 1 as including a single LED die, the LED may include multiple LED dies. The LED die 102 may be designed to generate light having a peak wavelength in the ultraviolet, blue or green wavelength range. The LED die 102 is situated on the leadframe 104 and is electrically connected to the other leadframe 106 via the wire 108. The leadframes 104 and 106 provide the electrical power needed to drive the LED die 102. The LED die 102 is encapsulated in the lamp 110, which is a medium for the propagation of light from the LED die 102. The lamp 110 includes a main section 112 and an output section 114. In this embodiment, the output section 114 of the lamp 110 is dome-shaped to function as a lens. Thus, the light emitted from the LED 100 as output light is focused by the dome-shaped output section 114 of the lamp 110. However, in other embodiments, the output section 114 of the lamp 100 may be horizontally planar.

The lamp 110 of the LED 100 is made of a transparent host matrix so that light from the LED die 102 can travel through the lamp and be emitted out of the output section 114 of the lamp. The host matrix may be polymer (formed from liquid or semisolid precursor material such as monomer), epoxy, silicone, glass or a hybrid of silicone and epoxy. In this embodiment, the lamp 110 includes a wavelength-shifting region 116, which is also a medium for propagating light, made of the host matrix and two types of photoluminescent materials, which include non-quantum fluorescent material 118 and quantum dots 119. The non-quantum fluorescent material 118 included in the wavelength-shifting region 116 may be one or more types of non-quantum phosphors, such as Garnet-based phosphors, Silicate-based phosphors, Orthosilicate-based phosphors, Thiogallate-based phosphors, Sulfide-based phosphors and Nitride-based phosphors. The non-quantum phosphors may be phosphor particles with or without a silica coating. Silica coating on phosphor particles reduces clustering or agglomeration of phosphor particles when the phosphor particles are mixed with the host matrix to form the wavelength-shifting region 116 of the lamp 110. Clustering or agglomeration of phosphor particles can result in an LED that produces output light having a non-uniform color distribution.

The silica coating may be applied to synthesized phosphor particles by subjecting the phosphor particles to an annealing process to anneal the phosphor particles and to remove contaminants. The phosphor particles are then mixed with silica powders, and heated in a furnace at approximately 200 degrees Celsius. The applied heat forms a thin silica coating on the phosphor particles. The amount of silica on the phosphor particles is approximately 1% with respect to the phosphor particles. Alternatively, the silica coating can be formed on phosphor particles without applying heat. Rather, silica powder can be added to the phosphor particles, which adheres to the phosphor particles due to Van der Waals forces to form a silica coating on the phosphor particles.

The non-quantum fluorescent material 118 included in the wavelength-shifting region 116 may alternatively include one or more organic dyes or any combination of non-quantum phosphors and organic dyes.

The quantum dots 119, also known as semiconductor nanocrystals, included in the wavelength-shifting region 116 are artificially fabricated devices that confine electrons and holes. Typical dimensions of quantum dots range from nanometers to few microns. Quantum dots have a photoluminescent property to absorb light and reemit different wavelength light, similar to phosphor particles. However, the color characteristics of emitted light from quantum dots depend on the size of the quantum dots and the chemical composition of the quantum dots, rather than just chemical composition as phosphor particles. Quantum dots are characterized by a bandgap smaller than the energy of at least a portion of the light emitted from the LED light source, e.g., the LED die 102.

The quantum dots 119 included in the wavelength-shifting region 116 may be quantum dots made of CdS, CdSe, CdTe, CdPo, ZnS, ZnSe, ZnTe, ZnPo, MgS, MgSe, MgTe, PbSe, PbS, PbTe, HgS, HgSe, HgTe and $Cd(S_{1-x}Se_x)$, or made from a metal oxides group, which consists of $BaTiO_3$, $PbZrO_3$, $PbZr_zTi_{1-z}O_3$, $Ba_xSr_{1-x}TiO_3$, $SrTiO_3$, $LaMnO_3$, $CaMnO_3$, $La_{1-x}Ca_xMnO_3$. The wavelength-shifting region 116 includes at least one type of quantum dots with respect to chemical composition and size. The type(s) of quantum dots included in the wavelength-shifting region 116 will partly depend on the wavelength deficiencies of the non-quantum fluorescent material 118. As an example, if the non-quantum fluorescent material 118 produces an output light that is deficient at around 600 nm, then a particular type of quantum dots can be selected that can produce converted light at around 600 nm to compensate for the deficiency, which will increase the CRI of the output light. The quantum dots 119 included in the wavelength-shifting region 116 may or may not be coated with a material having an affinity for the host matrix. The coating passivates the quantum dots 119 to prevent agglomeration or aggregation to overcome the van der Waals binding force between the quantum dots.

The coating on the quantum dots 119 can be (a) organic caps, (b) shells or (c) caps made of glass material, such as Si nanocrystals. Organic caps can be formed on quantum dots using $Ag_2S$ and $Cd(OH)_2$, which may preferably be passivated with $Cd^{2+}$ at high pH. A surface modification of the quantum dots is then performed by attaching dyes to the surface of the quantum dots. As an example, CdSe surface surfactant is labile and can be replaced by sequential addition of $Se^+$ and $Cd^{2+}$, which can grow to make a seed (quantum dot) larger. For $Cd^{2+}$ rich surface, the surface can be treated with $Ph-Se^-$ and an organic coating is covalently linked to the surface. This isolation of molecular particles is referred to as "capped". Types of known capping molecules include Michelle liquids (Fendler), Tio-terminations (S-based) (Weller-Hamburg), Phosphate termination (Berwandi-MIT), Nitrogen termination (pyridine, pyrazine) and Dendron caps (multi-stranded ligands) (Peng).

Shells are coatings on inner core material (quantum dots). Generally, coating material that forms the shells can be oxide or sulfide based. Examples of shell/core are $TiO_2$/Cds, ZnO/CdSe, ZnS/Cds and $SnO_2$/CdSe. For CdSe core, it can also be coated with ZnS, ZnSe (selenide based) or CdS, which improves the efficiency of the CdSe dramatically.

The wavelength-shifting region 116 or the entire lamp 10 may include dispersant or diffusing particles that are distributed throughout the region. The diffusing particles operates to diffuse light of different wavelengths emitted from the LED die 102, the non-quantum fluorescent material 118 and the quantum dots 119 so that color of the resulting output light is more uniform. The diffusing particles may be silica, silicon dioxide, aluminum oxide, barium titanate, and/or titanium oxide. The wavelength-shifting region 116 or the entire lamp 10 may also include adhesion promoter and/or ultraviolet (UV) inhibitor.

The non-quantum fluorescent material 118 included in the wavelength-shifting region 116 absorbs some of the original light emitted from the LED die 102, which excites the atoms of the non-quantum fluorescent material, and emits longer wavelength light. Similarly, the quantum dots 119 absorb some of the original light emitted from the LED die 102, which excites the quantum dots, and emits longer wavelength light. The wavelength of the light emitted from the quantum dots 119 depends on the size of the quantum dots. In an implementation, the light emitted from the non-quantum fluorescent material 118 and the light emitted from the quantum dots 119 are combined with unabsorbed light emitted from the LED die 102 to produce broad-spectrum color light, which is emitted from the light output section 114 of the lamp 110 as output light of the LED 100. In another implementation, virtually all the light emitted from the LED die 102 is absorbed and converted by the non-quantum fluorescent material 118 and the quantum dots 119. Thus, in this implementation, only the light converted by the non-quantum fluorescent material 118 and the quantum dots 119 is emitted from the light output section 114 of the lamp 110 as output light of the LED 100.

The combination of the light emitted from the non-quantum fluorescent material 118 and the quantum dots 119 can produce broad-spectrum color light that has a higher CRI than light emitting using only the non-quantum fluorescent material 118 or using only the quantum dots 119. The broad-spectrum color output light of the LED 100 can be adjusted by using one or more different LED dies, using one or more different non-quantum fluorescent materials, using one or more different types of quantum dots and/or using different sized quantum dots. In addition, the broad-spectrum color output light of the LED 100 may also be adjusted using non-quantum fluorescent material of phosphor particles with or without a silica coating, using quantum dots with or without a coating and/or using different type of coating on the quantum dots. Furthermore, the ratio between the non-quantum fluorescent material 118 and the quantum dots 119 included in the wavelength-shifting region 116 can be adjusted to produce output light having desired color characteristics.

Although the wavelength-shifting region 116 of the lamp 110 is shown in FIG. 1 as being rectangular in shape, the wavelength-shifting region may be configured in other shapes, such as a hemisphere, as shown in FIG. 3A. Furthermore, in other embodiments, the wavelength-shifting region 116 may not be physically coupled to the LED die 102. Thus, in these embodiments, the wavelength-shifting region 116 may be positioned elsewhere within the lamp 110.

Figure 2A:
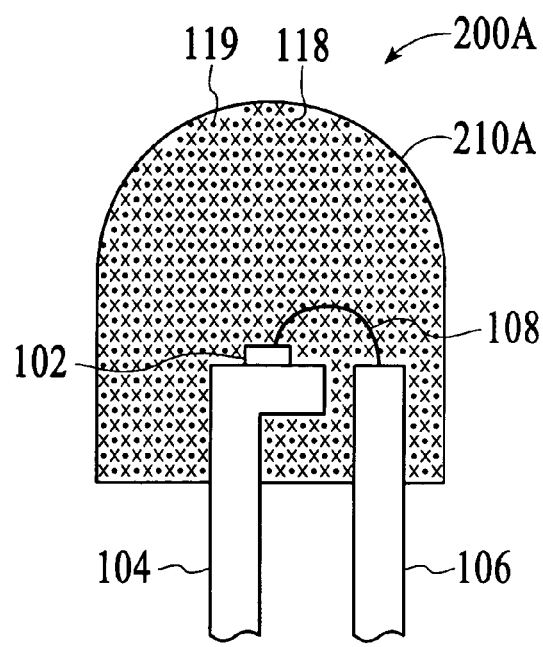
FIGS. 2A, 2B and 2C are diagrams of LEDs with alternative lamp configurations in accordance with an embodiment of the invention.
Figure 2B:
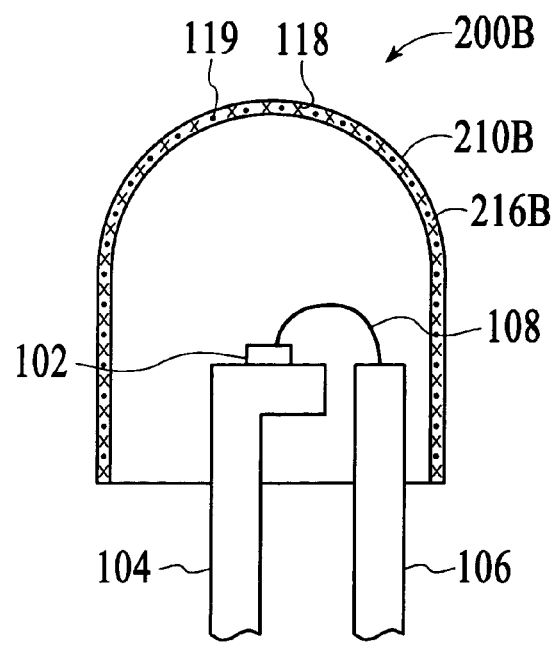
Figure 2C:
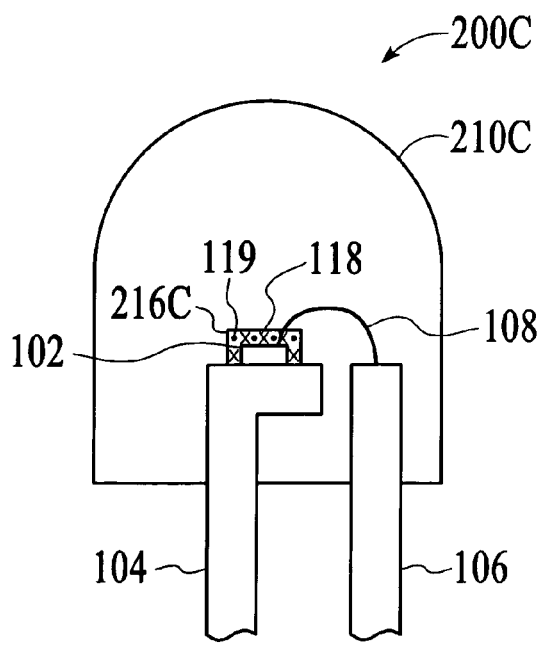

In FIGS. 2A, 2B and 2C, LEDs 200A, 200B and 200C with alternative lamp configurations in accordance with an embodiment of the invention are shown. The LED 200A of FIG. 2A includes a lamp 210A in which the entire lamp is a wavelength-shifting region. Thus, in this configuration, the entire lamp 210A is made of the mixture of the host matrix, the non-quantum fluorescent material 118 and the quantum dots 119. The LED 200B of FIG. 2B includes a lamp 210B in which a wavelength-shifting region 216B is located at the outer surface of the lamp. Thus, in this configuration, the region of the lamp 210B without the non-quantum fluorescent material 118 and the quantum dots 119 is first formed over the LED die 102 and then the mixture of the host matrix and the photoluminescent materials is deposited over this region to form the wavelength-shifting region 216B of the lamp. The LED 200C of FIG. 2C includes a lamp 210C in which a wavelength-shifting region 216C is a thin layer of the mixture of the host matrix 117, the non-quantum fluorescent material 118 and the quantum dots 119 coated over the LED die 102. Thus, in this configuration, the LED die 102 is first coated or covered with the mixture of the host matrix 117, the non-quantum fluorescent material 118 and the quantum dots 119 to form the wavelength-shifting region 216C and then the remaining part of the lamp 210C can be formed by depositing the transparent substance without the photoluminescent materials over the wavelength-shifting region. As an example, the thickness of the wavelength-shifting region 216C of the LED 200C can be between ten (10) and sixty (60) microns, depending on the emission characteristics of the LED die 102.

In an alternative embodiment, the leadframe of a LED on which the LED die is positioned may include a reflector cup, as illustrated in FIGS. 3A, 3B, 3C and 3D. FIGS. 3A–3D show LEDs 300A, 300B, 300C and 300D with different lamp configurations that include a leadframe 320 having a reflector cup 322. The reflector cup 322 provides a depressed region for the LED die 102 to be positioned so that some of the light generated by the LED die is reflected away from the leadframe 320 to be emitted from the respective LED as useful output light.

The different lamp configurations described above can be applied to other types of LEDs, such as surface-mounted LEDs, to produce other types of LEDs with the non-quantum fluorescent material 118 and the quantum dots 119 in accordance with the invention. In addition, these different lamp configurations may be applied to other types of light emitting devices, such as semiconductor lasing devices, to produce other types of light emitting devices in accordance with the invention. In these light emitting devices, the light source can be any light source other than an LED die, such as a laser diode.

Figure 4:
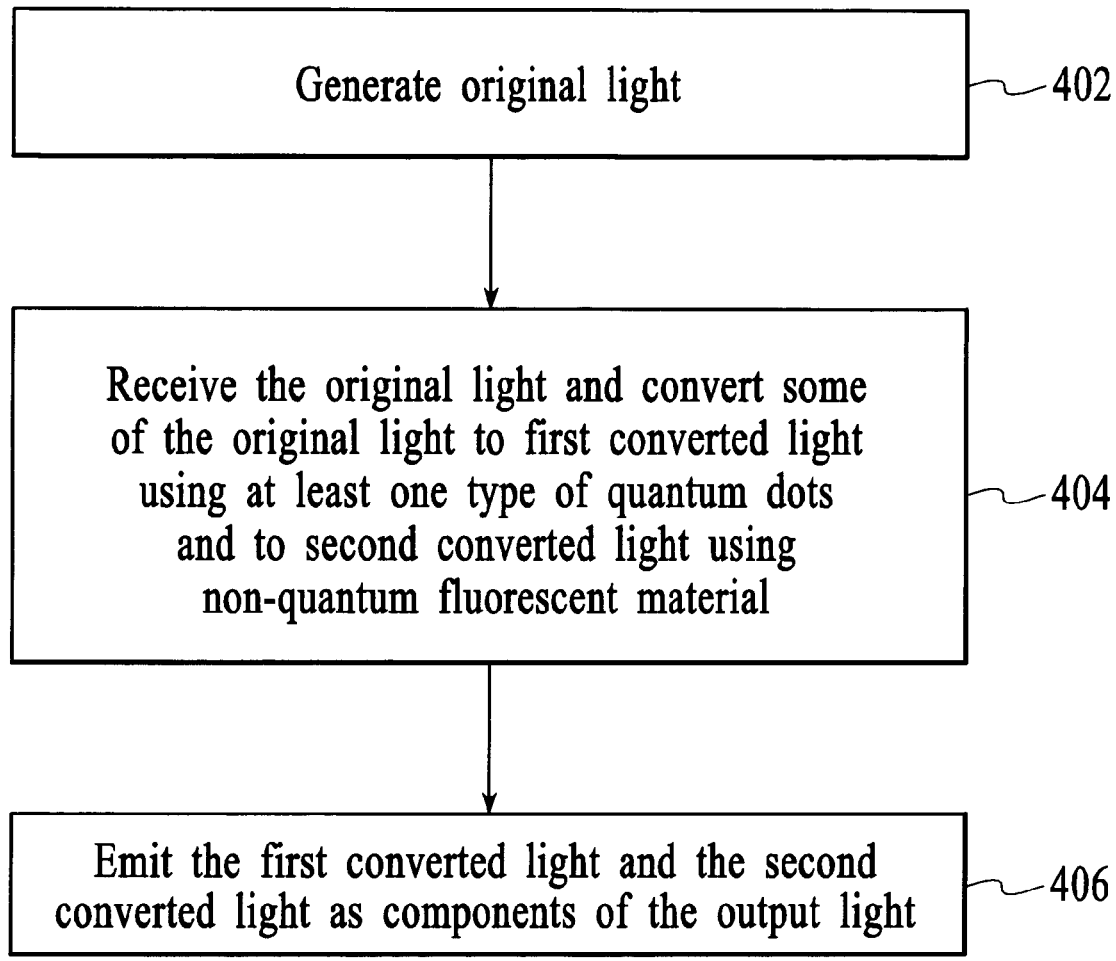
FIG. 4 is a flow diagram of a method for emitting output light in accordance with an embodiment of the invention.

A method for producing output light in accordance with an embodiment of the invention is described with reference to FIG. 4. At block 402, original light is generated. The original light may be generated by a light source that includes one or more LED dies. Next, at block 404, the original light is received and some of the original light is converted to first converted light using at least one type of quantum dots. In addition, at block 404, some of the original light may also be converted to second converted light using non-quantum fluorescent material. Next, at block 406, the first converted light and the second converted light are emitted as components of the output light. The output light may also include some of the original light that was not converted by the quantum dots or the non-quantum fluorescent material.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device for emitting output light, said device comprising:
   a light source that emits original light; and
   a wavelength-shifting region optically coupled to said light source to receive said original light, said wavelength-shifting region including at least one type of quantum dots to convert some of said original light to first converted light, said wavelength-shifting region further including non-quantum fluorescent material to convert some of said original light to second converted light, said first converted light and said second converted light being components of said output light.

2. The device of claim 1 wherein said non-quantum fluorescent material includes phosphor particles.

3. The device of claim 2 wherein said phosphor particles have a silica coating.

4. The device of claim 2 wherein said non-quantum fluorescent material includes a phosphor selected from a group consisting of Garnet-based phosphor, Silicate-based phosphor, Orthosilicate-based phosphor, Thiogallate-based phosphor, Sulfide-based phosphor and Nitride-based phosphor.

5. The device of claim 1 wherein said quantum dots have a coating of selected material.

6. The device of claim 5 wherein said coating of said quantum dots includes organic caps, quantum dot shells or caps made of glass material.

7. The device of claim 1 wherein said quantum dots includes one of CdS, CdSe, CdTe, CdPo, ZnS, ZnSe, ZnTe, ZnPo, MgS, MgSe, MgTe, PbSe, PbS, PbTe, HgS, Hgse, HgTe, $Cd(S_{1-x}Se_x)$, $BaTiO_3$, $PbZrO_3$, $PbZr_zTi_{1-z}O_3$, $Ba_xSr_{1-x}TiO_3$, $SrTiO_3$, $LaMnO_3$, $CaMnO_3$ and $La_{1-x}Ca_xMnO_3$.

8. The device of claim 1 wherein said wavelength-shifting region includes silicone, glass, epoxy or a hybrid material of silicone and epoxy.

9. The device of claim 1 wherein said wavelength-shifting region includes at least one of ultraviolet inhibitor and adhesion promoter.

10. The device of claim 1 wherein said light source includes at least one light emitting diode die.

11. A method for emitting output light, said method comprising:
generating original light;
receiving said original light, including converting some of said original light to first converted light using at least one type of quantum dots and converting some of said original light to second converted light using non-quantum fluorescent material; and
emitting said first converted light and said second converted light as components of said output light.

12. The method of claim 11 wherein said non-quantum fluorescent material includes phosphor particles.

13. The method of claim 12 wherein said phosphor particles have a silica coating.

14. The method of claim 12 wherein said non-quantum fluorescent material includes a phosphor selected from a group consisting of Garnet-based phosphor, Silicate-based phosphor, Orthosilicate-based phosphor, Thiogallate-based phosphor, Sulfide-based phosphor and Nitride-based phosphor.

15. The method of claim 11 wherein said quantum dots have a coating of selected material.

16. The method of claim 15 wherein said coating of said quantum dots includes organic caps, quantum dot shells or caps made of glass material.

17. The method of claim 11 wherein said quantum dots includes one of CdPo, ZnTe, ZnPo, MgS, MgTe, PbSe, PbS, PbTe, HgS, HgSe, HgTe, $Cd(S_{1-x}Se_x)$, $BaTiO_3$, $PbZrO_3$, $PbZr_zTi_{1-z}O_3$, $Ba_xSr_{1-x}TiO_3$, $SrTiO_3$, $LaMnO_3$, $CaMnO_3$ and $La_{1-x}Ca_xMnO_3$.

18. A device for emitting output light, said device comprising:
a light source that emits original light; and
a wavelength-shifting region optically coupled to said light source to receive said original light, said wavelength-shifting region including at least one type of quantum dots to convert some of said original light to first converted light, said wavelength-shifting region further including a plurality of non-quantum phosphor particles to convert some of said original light to second converted light, said first converted light and said second converted light being components of said outputs light.

19. The device of claim 18 wherein said quantum dots or said phosphor particles have a coating of selected material.

20. The device of claim 19 wherein said coating includes organic caps, quantum dot shells or caps made of glass material on said quantum dots.

* * * * *